United States Patent
Shima

Patent Number: 5,488,614
Date of Patent: Jan. 30, 1996

[54] INTEGRATED LOGIC CIRCUIT

[75] Inventor: Tomoaki Shima, Tokyo, Japan

[73] Assignee: NEC Corporation, Japan

[21] Appl. No.: 36,171

[22] Filed: Mar. 23, 1993

[30] Foreign Application Priority Data

Mar. 24, 1992 [JP] Japan ................... 4-066449

[51] Int. Cl.⁶ .................................. G06F 13/12
[52] U.S. Cl. ............ 371/22.3; 364/490; 371/20.4
[58] Field of Search ................ 371/22.3, 25.1, 371/22.1, 20.4; 364/490, 489; 324/523, 755, 765

[56] References Cited

U.S. PATENT DOCUMENTS

| | | | |
|---|---|---|---|
| 4,872,169 | 10/1989 | Whetsel, Jr. ................. | 371/22.3 |
| 4,893,072 | 1/1990 | Matsumoto .................. | 371/22.3 |
| 4,897,838 | 1/1990 | Tateishi ........................ | 371/22.3 |
| 4,961,013 | 10/1990 | Obermeyer, Jr. et al. ... | 371/22.3 |
| 5,109,190 | 4/1992 | Sakashita et al. ............ | 371/22.3 |
| 5,210,759 | 5/1993 | DeWitt et al. ................ | 371/22.3 |
| 5,252,917 | 10/1993 | Kadowaki .................... | 371/22.3 |
| 5,271,019 | 12/1993 | Edwards et al. ............. | 371/22.3 |
| 5,349,587 | 9/1994 | Nadeau-Dostie et al. ... | 371/22.3 |

OTHER PUBLICATIONS

IEEE std 1149.1–1990, pp. 1–5.

Primary Examiner—Emanuel T. Voeltz
Assistant Examiner—Thomas Peeso
Attorney, Agent, or Firm—Laff, Whitesel, Conte & Saret, Ltd.

[57] ABSTRACT

An integrated logic circuit is provided with a plurality of test circuits for performing a Boundary-scan test. Each of the test circuits receives a clock signal, and comprises a first latch circuit for latching supplied data in response to a trailing edge of a clock signal, a second latch circuit for latching output data from the first latch circuit in response to the leading edge of the clock signal and a third latch circuit for latching output data from the second latch circuit in response to the trailing edge of the clock signal. A pulse width of the clock signal is adjusted in accordance with a delay time of the clock signal.

10 Claims, 6 Drawing Sheets

INTEGRATED LOGIC CIRCUIT

BACKGROUND OF THE INVENTION

1. Field of the Invention

The present invention relates to an integrated logic circuit and, more particularly, to a circuit which facilitates a test of a circuit board or other substrates on which semiconductor integrated circuits chips are assembled.

2. Description of the Related Art

FIG. 1 shows a circuit board to which a Boundary-scan technique is applied. In the case of the Boundary-scan technique, a scan path method is utilized to test a plurality of integrated logic circuits on a circuit board. The scan path method is one of method designed to enable testing of semiconductor integrated logic circuits, and is described in IEEE std 1149.1-1990, pp1–5. This description is incorporated in the present specification by way of the reference.

As shown in FIG. 1, four integrated logic circuit chips 52a–52d are arranged on a circuit board 51. Each of the integrated logic circuit chips 52a–52d is provided with internal logic circuits 53a–53d, input/output terminals 58 connected to the integrated logic circuits 52a–52d, and test circuits 56 provided between input/output buffers of the internal logic circuits 53a–53d and the input/output terminals 58.

In a normal operation, the input/output terminals 58 are mutually connected via a signal lines 57 (indicated by thin lines). In a test operation, the scan-in terminal 54 of the circuit board 51 is connected to the scan-in terminal of the integrated logic circuit chip 52a. The scan-out terminals of the integrated logic circuit chips 52a–52c are connected to the scan-in terminals of the integrated logic circuit chips 52b–52d, respectively. The scan-out terminal of the integrated logic circuit chip 52d is connected to the scan-out terminal 55 of the circuit board 51 (Signal lines used in a test operation are indicated by thick lines).

In response to a control signal (not shown) externally supplied when a test operation is performed, the test circuits 56 form a shift register. The shift register serves as a dedicated path for transferring the test data from the scan-in terminal 54 to the scan-out terminal 55.

When the circuit board 51 is tested, the test data is supplied to the scan-in terminal 54 serially and the supplied test data is transferred through the shift registers in synchronism with a clock signal (not shown). When each item of the test data reaches an associated test circuit 56 constituting the shift register, the test data is supplied from the test circuits 56 to the internal logic circuits 53a–53d, which perform predetermined data processing on the supplied test data. The results of the data processing (test results) are supplied to the test circuits 56, transferred through the shift registers in synchronism with the clock signal, and then output to the scan-out terminal 55.

As shown in the circuit shown in FIG. 1, as the number of input/output buffers in the internal logic circuits 53a–53d increases, the number of stages of the shift register constituted by the test circuits 56 increases. When the stages of the shift register are increased, the delay time of the clock signal driving the shift register also increases. Consequently, the timing of data-transfer through the shift register is liable to slow down, with the result that the shift register may operate incorrectly.

This problem will now be described in detail. FIG. 2 shows a part of a circuit equivalent to the shift register constituted by the test circuits 56. In the shift register shown in FIG. 2, pairs of flip-flops and delay circuits are serially connected. The flip-flops 21 and 22 corresponding to the test circuits 56 receive an output data from the preceding flip-flops in synchronism with the clock signal. The delay circuit 23 is formed by a parasitic capacitor and a parasitic inductance of the signal line transmitting the clock signal, and delays the supplied clock signal.

Each of the flip-flops 21 and 22 generally comprises a master-slave flip-flop, as shown in FIG. 3. The master-slave flip-flop shown in FIG. 3 comprises a master latch 41 and a slave latch 42 each having inverters 43 and switches 44a and 44b.

The master latch 41 opens the switch 44a to latch data supplied to the terminal 4a in response to the leading edge of the clock signal supplied to a clock terminal 4c (the trailing edge of the output from the inverter 43). The switch 44b of the slave latch 42 is opened on the trailing edge of the clock signal, so that the slave latch 42 latches the data from the master latch 41 and outputs it to the data output terminal 4b.

FIGS. 4A–4E show timing charts explaining the operation of the flip-flops 21 and 22, wherein the master-slave flip-flop shown in FIG. 3 is used in the same manner as the flip-flops shown in FIG. 2.

In a conventional master-slave flip-flop, the switches 44a and 44b are opened on the leading and trailing edges, respectively. Accordingly, the flip-flop 21 latches the input data D, shown in FIG. 4A, in response to the clock signal C shown in FIG. 4B, and outputs the data D', as shown in FIG. 4C.

Assume now that the clock signal C is changed or deformed by the delay circuit 23 to a signal C', as shown in FIG. 4D, and then supplied to the flip-flop 22. In this case, as shown in FIG. 4E, the flip-flop 22 ignores the high level data 2a output from the flip-flop 21 shown in FIG. 4C. As a result, the data cannot be transferred correctly.

SUMMARY OF THE INVENTION

The present invention has been developed in light of the above-described drawbacks and its object is to provide an integrated logic circuit which is constituted based on a test-facilitating design method and which can prevent incorrect operation of a shift register formed by test circuits.

Another object of the present invention is to provide a shift register with higher reliability.

In order to achieve the above object, a semiconductor integrated logic circuit according to the present invention comprises an internal logic circuit; input/output terminals connected to the internal logic circuit; test circuits arranged for the input/output terminals respectively and for testing an operation of the internal logic circuit; and means for supplying a clock signal to the test circuits, wherein the test circuits constitute a shift register for a scan-test, and which transfers externally supplied test data to the internal logic circuit, shifts the output of the internal logic circuit, and supplies the shifted output externally; each of the test circuits is provided with a first latch circuit for latching supplied data in response to one of the leading and trailing edges of the clock signal; a second latch circuit for latching output data from the first latch circuit in response to the other of the leading and trailing edges of the clock signal; and a third latch circuit for latching output data from the second latch circuit in response to one of the leading and trailing edges of the clock signal.

According to the integrated logic circuit of the present invention constructed as above, appropriate adjustment of the pulse width of the clock signal can contribute to proper data transfer in spite of a delay in the clock signal. As a result, a scan test can be performed correctly.

In order to achieve the above object, a shift register according to the present invention comprises a plurality of registers which are serially connected; and clock signal supplying means, for supplying a clock signal to the plurality of registers; and wherein each of the registers comprises, a first latch circuit for latching supplied data in response to one of the leading and trailing edges of the clock signal; a second latch circuit for latching the output data from the first latch circuit in response to the other of the leading and trailing edges of the clock signal; and a third latch circuit for latching the output data from the second latch circuit in response to one of the leading and trailing edges of the clock signal.

According to the shift register of the present invention constructed as above, the adequate adjustment of the pulse width of the clock signal can contribute to the proper data transfer in spite of the delay of the clock signal.

DETAILED DESCRIPTION OF THE PREFERRED EMBODIMENTS

Figure 1:
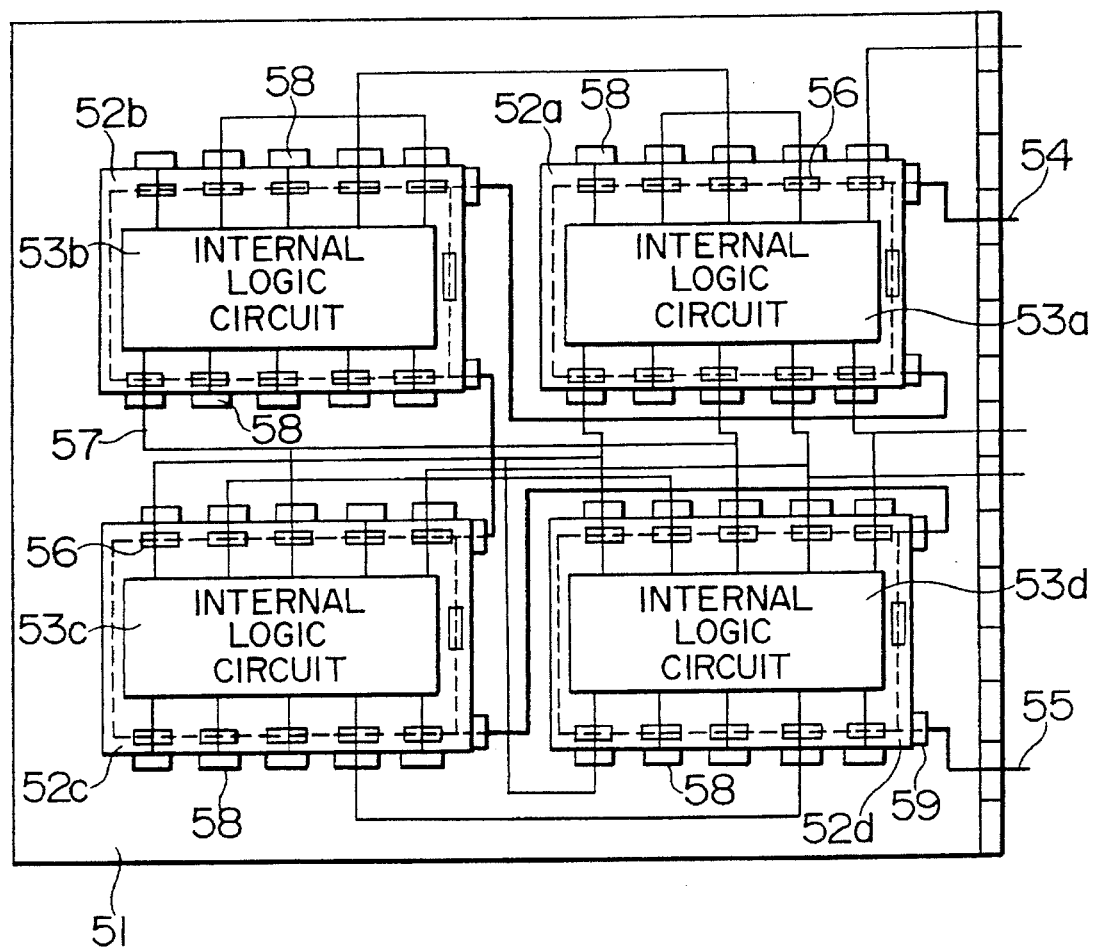
FIG. 1 is a block diagram showing an example of a circuit board to which a conventional Boundary-scan technique is applied.
Figure 2:
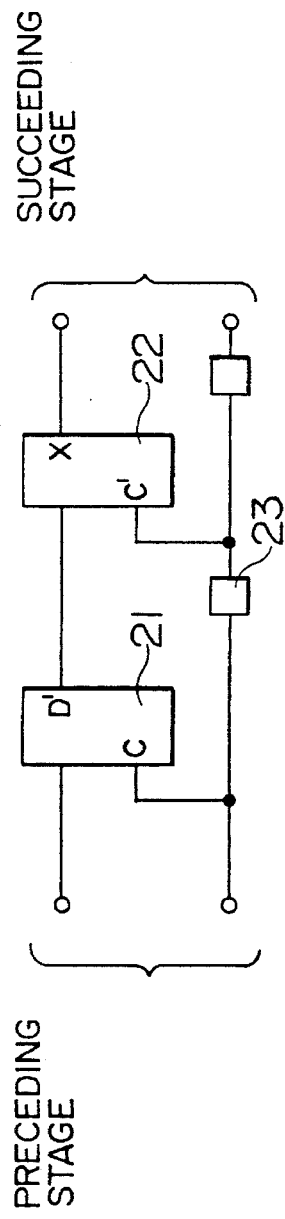
FIG. 2 is a block diagram showing an arrangement of a shift register.
Figure 3:
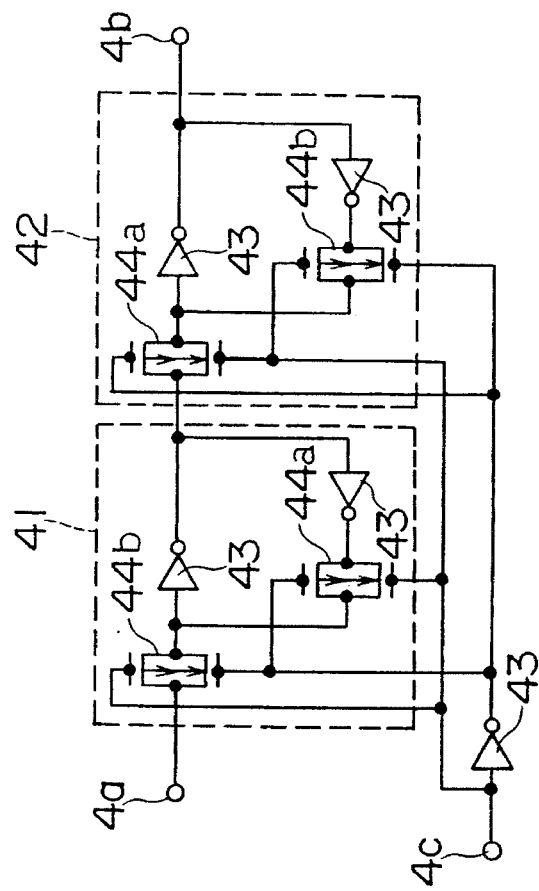
FIG. 3 is a block diagram showing an example arrangement of a master-slave flip-flop.
Figures 4A, 4B, 4C, 4D, 4E:
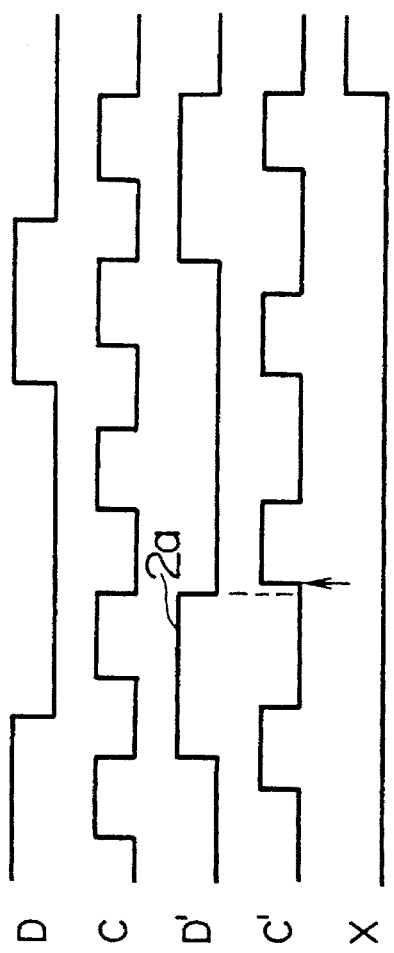
FIGS. 4A through 4E are timing charts showing operation timings of the flip-flops shown in FIG. 2 and constituted by the master-slave flip-flops shown in FIG. 3.
Figure 5:
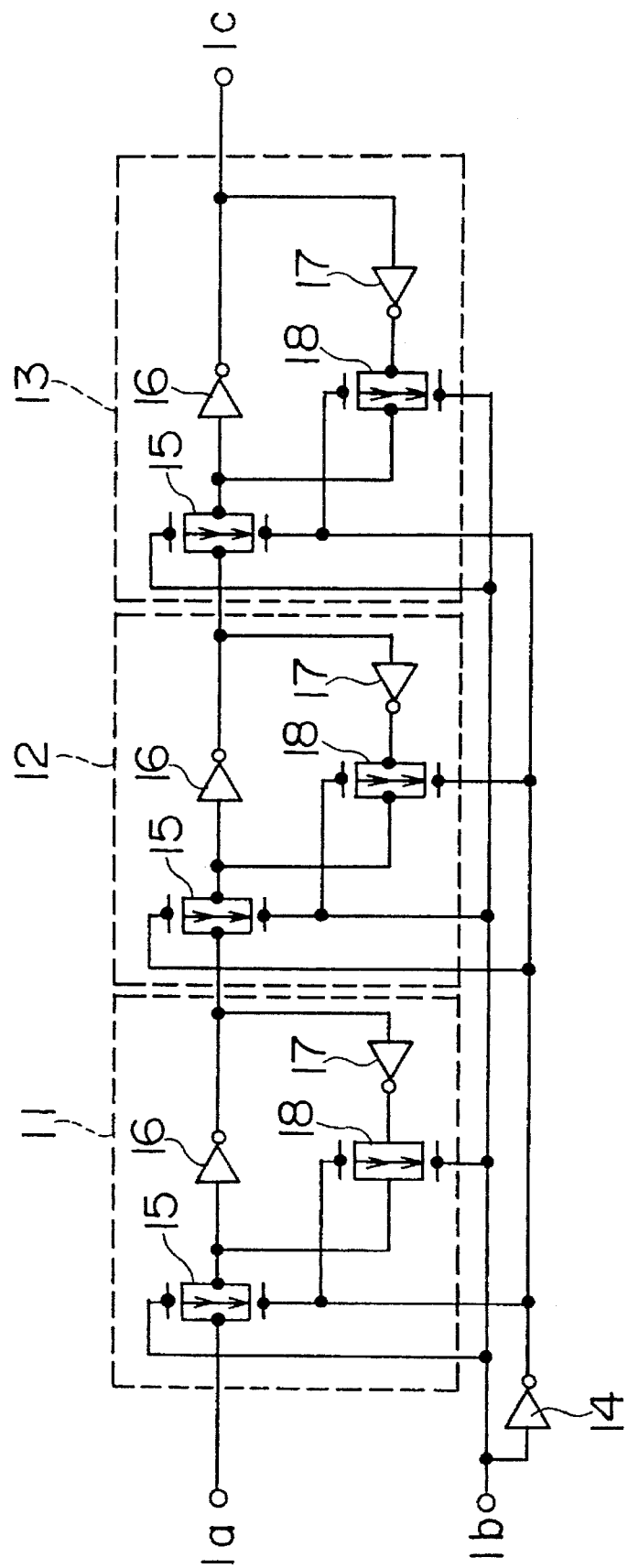
FIG. 5 is a block diagram showing an arrangement of a test circuit (flip-flop) according to an embodiment of the present invention.

FIG. 5 shows a test circuit (flip-flop) according to an embodiment of the present invention. The test circuit comprises three latch circuits, 11, 12 and 13, which are connected serially.

Each of the latch circuits 11, 12 and 13 comprises a switch 15 connected to a data input terminal, an inverter 16 an input terminal of which is connected to the switch 15 and an output terminal of which is connected to a data output terminal, an inverter 17 an input terminal of which is connected to the data output terminal, and a switch 18 connected between the output terminal of the inverter 17 and the input terminal of the inverter 16.

A clock signal supplied to the clock terminal 1b and a clock signal inverted by the inverter 14 are supplied to the switches 15 and 18, in each of the latch circuits 11, 12 and 13.

The switches 18 of each of the latch circuits 11 and 13 are turned on at the leading edge of the clock signal, while the switches 18 of the latch circuit 12 are turned on at the trailing edge of the clock signal. The inverters 16 and 17 latch input data when the switches 18 are turned on.

The latch circuit 11 latches and outputs data supplied to the input terminal 1a at the leading edge of the clock signal, while the latch circuit 12 latches and outputs the output data from the latch circuit 11 at the trailing edge of the clock signal. The latch circuit 13 latches and outputs the output data from the latch circuit 12 at the leading edge of the clock signal.

In summary, the test circuit shown in FIG. 5 latches data supplied to the data input terminal 1a at the leading edge of the clock signal supplied to the clock terminal 1b and outputs the latched data at the succeeding leading edge.

An operation of the shift register using the test circuit shown in FIG. 5 as the flip-flops 21 and 22 will now be described, with reference to FIGS. 6A through 6E.

Figures 6A, 6B, 6C, 6D, 6E:
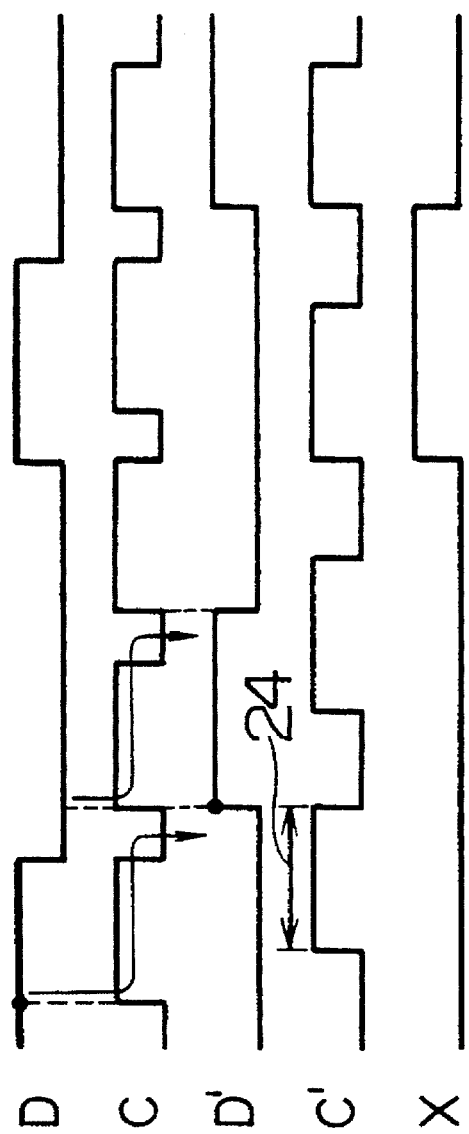
FIGS. 6A through 6E are timing charts showing operation timings of the flip-flops shown in FIG. 2 and constituted by the flip-flops shown in FIG. 5.

The input data D shown in FIG. 6A is latched by the latch 21 at the leading edge of the clock signal C shown in FIG. 6B and output at the succeeding leading edge, as shown in FIG. 6C.

Even if the clock signal C is substantially delayed or deformed to a signal C', as shown in FIG. 6D, by the delay circuit 23, the flip-flop 22 can latch the output data of the flip-flop 21 correctly, as shown in FIG. 6E, by widening the pulse width 24 of the clock signal C. More specifically, according to this embodiment, the pulse width of the clock signal C is set wider, taking account of the amount of delay of the clock signal C (maximum delay amount), to thereby prevent an incorrect operation. In this embodiment, the amount of delay is defined as a maximum amount (time) among the delay times of the clock signal between two adjacent flip-flops. The grater as the maximum amount, the more the pulse width is increased.

Figure 7:
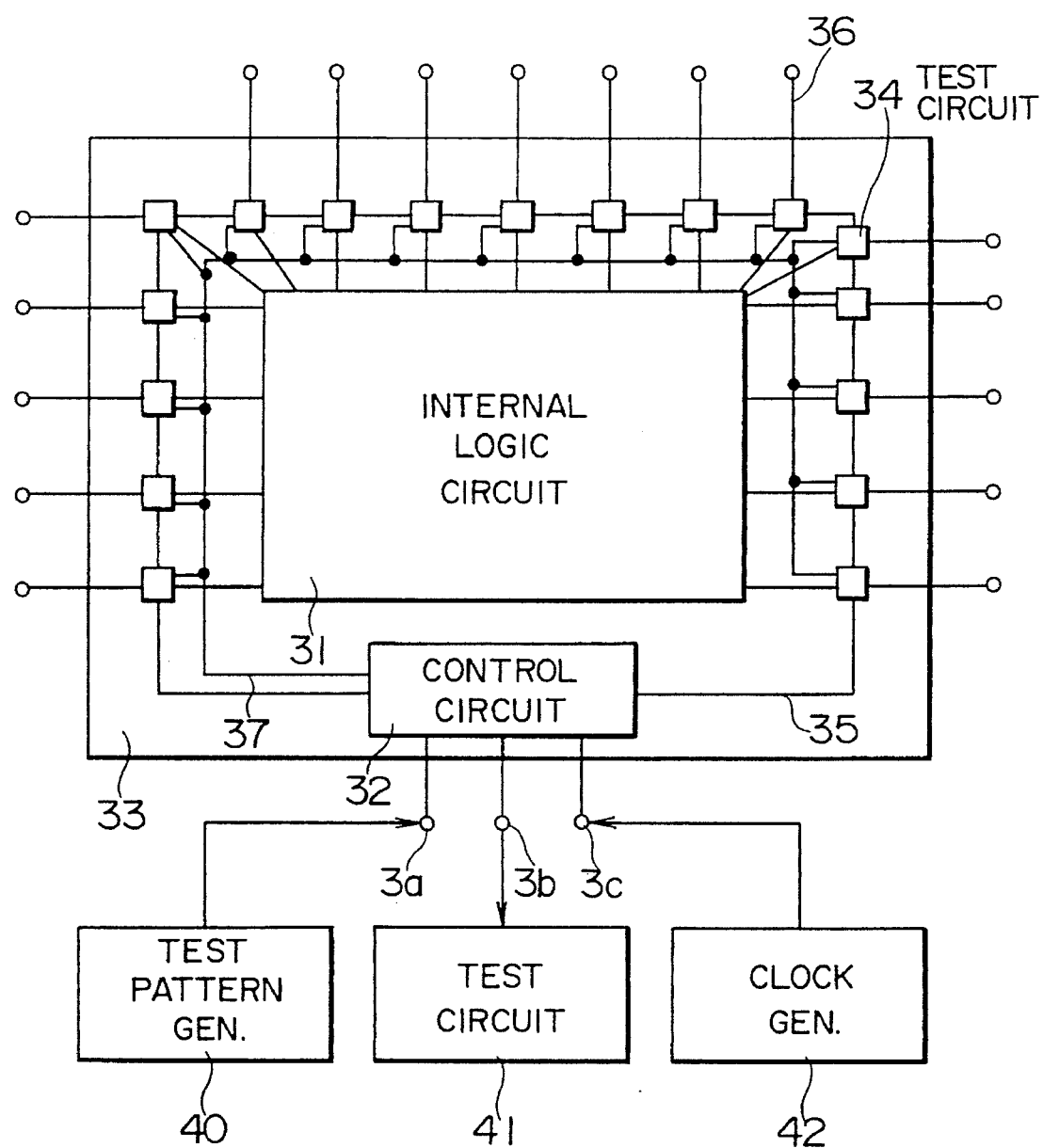
FIG. 7 is a block diagram showing an example of an integrated logic circuit using the test circuits shown in FIG. 5.

FIG. 7 is a block diagram showing an integrated logic circuit 33 according another embodiment of the present invention. In this integrated logic circuit, the test circuits 34 for executing the Boundary-scan test comprise the latch circuits shown in FIG. 5.

In the integrated logic circuit 33, each of the test circuits 34 is arranged between an associated input/output buffer (not shown) in the internal logic circuit 31 and an associated input/output terminal 36. The test circuits 34 are connected serially when the Boundary-scan test is executed, and constitute, together with a control circuit 32, a shift register. The control circuit 32 is provided with a data input terminal 3a, a data output terminal 3b, and a clock input terminal 3c.

Connected to the data input terminal 3a is a test pattern Generator 40 for Generating a test pattern used in the Boundary-scan test. The data input terminal 3a may be connected the test pattern Generator 40 through preceding integrated logic circuits.

Connected to the data output terminal 3b is a test circuit 41 for comparing the data output from the data output terminal 3b with an expected value. The data output terminal 3b may be connected the test circuit 41 through succeeding integrated logic circuits.

In addition, a clock generator 42 is connected to the clock terminal 3c.

In the normal state, the test circuit 34 does not operate substantially. Thus, the output data from the internal logic circuit 31 is supplied to the input/output terminals 36 as it is, and the input data externally supplied to the input/output terminals 36 is supplied to the internal logic circuit 31 as it is.

When the Boundary-scan test is executed, the clock signal is supplied to the clock input terminal 3c from the clock generator 42. The clock signal is supplied to all the test circuits 34 through the clock signal line 37. The pulse width of the clock signal is determined by taking account of the maximum value of the delay time of the clock signal between the two adjacent test circuits 34.

The test data is serially supplied to the data input terminal 3a. The test circuits 34 sequentially transfer the test data in synchronism with the clock signal. When all the test data items are set in the corresponding test circuits 34, the internal logic circuit 31 fetches data from the respective test circuits 34, executes data processing for the test, and sets the test results in the test circuits 34.

Thereafter, the clock signal is supplied again to the clock input terminal 3c. The test circuits 34 sequentially shift the set data and supply them to the data output terminal 3b. It can be tested whether or not the internal logic circuit 31 is operating correctly by determining whether the data output from the data output terminal 3b coincides with the expected data pattern.

In order to execute the Boundary-scan test correctly, the test circuits in the conventional integrated logic circuit must be arranged such that the amount of delay of the clock signal between the test circuits is not substantial. Alternatively, the master latch and the slave latch constituting the test circuit must be operated independently by using two-phase clock signals. In the integrated logic circuit according to this embodiment, the Boundary-scan test can be executed correctly by widening the pulse width as the amount of delay of the clock signal increases. Thus, the layout of the clock signal lines and the test circuits is not a critical factor.

The present invention is not limited to the above embodiments. For example, the latches constituting the test circuits are not limited to the latches 11, 12 and 13, and may be of other known arrangements. Further, in the above embodiment, the latches 11 and 13 latch the input data at the leading edge of the clock signal and the latch 12 latches the input data at the trailing edge of the clock signal. However, the latches 11 and 13 may latch the input data at the trailing edge of the clock signal and the latch 12 may latch the input signal at the leading edge of the clock signal.

Not only the shift register for the Boundary-scan test but also normal shift registers cannot shift data correctly if the clock signal is delayed. In order to avoid this drawback, the normal shift register may comprise the circuit shown in FIG. 5. Similarly, the test circuit for implementing the scan path method of the semiconductor integrated logic circuit may comprise the register shown in FIG. 5.

What is claimed is:

1. A semiconductor integrated logic circuit comprising:
an internal logic circuit;
a plurality of input/output terminals respectively connected to said internal logic circuit;
a plurality of test circuits respectively interposed between said internal logic circuit and said input/output terminals, said test circuits forming a shift register by establishing a series signal path during a testing condition, each of said test circuits including first, second and third latch circuits, said first and third latch circuits being active in a common response to a first phase of a clock signal and said second latch circuit being active in response to a second phase of said clock signal, said second phase being opposite to said first phase of said clock signal.

2. A semiconductor integrated logic circuit as set forth in claim 1, wherein said first, second and third latch circuits are connected to form a cascaded circuit.

3. A semiconductor integrated logic circuit as set forth in claim 2, wherein said first latch circuit latches supplied data in response to one of the leading and trailing edges of said clock signal, said second latch circuit latches output data from said first latch circuit in response to the other of the leading and trailing edges of said clock signal, and said third latch circuit latches output data from said second latch circuit in response to said one of the leading and trailing edges of said clock signal.

4. A semiconductor integrated logic circuit as set forth in claim 3, wherein said test circuits form a shift register by establishing a series signal path for supplying a predetermined input test data to said internal logic circuit by sequentially shifting said input test data and receiving processed data from said internal logic circuit for sequentially shifting to a data output for comparison with a predetermined data pattern corresponding to said input test data during testing conditions while each of said test circuits passes output data of said internal logic circuit as is to said input/output terminal.

5. The circuit according to claim 3, wherein the clock signal supplying means comprises means for generating the clock signal, and means for transmitting the generated clock signal to the respective test circuits, and the generating means adjusts a pulse width of the clock signal in accordance with a delay of the clock signal caused by a transmission of said clock signal by the transmitting means.

6. The circuit according to claim 3, wherein the pulse width of the clock signal is widened in accordance with an amount of delay of the clock signal, to prevent a malfunction of the shift register constituted by the test circuits, and said amount of delay is determined corresponding to a possible maximum delay in a transferring of said clock signal between adjacent test circuits.

7. A semiconductor integrated logic circuit comprising:
an internal logic circuit;
a plurality of input/output terminals respectively connected to said internal logic circuit;
a plurality of test circuits respectively interposed between said internal logic circuit and said input/output terminals, said test circuits forming a shift register by establishing a series signal path for supplying a predetermined input test data to said internal logic circuit by sequentially shifting said input test data and for receiving processed data from said internal logic circuit by sequentially shifting to a data output for comparison with a predetermined data pattern corresponding to said input test data during a testing condition while each of said test circuits passes output data of said internal logic circuit as is to said input/output terminal,
each of said test circuits including first, second and third latch circuits, said first and third latch circuits being active in a common response to a first phase of a clock signal and said second latch circuit being active in response to a second phase of said clock signal which is opposite to said first phase of said clock signal.

8. A semiconductor integrated logic circuit as set forth in claim 7, wherein said first, second and third latch circuits are connected to form a cascaded circuit.

9. A semiconductor integrated logic circuit as set forth in claim 8, wherein said first latch circuit latches supplied data in response to one of the leading and trailing edges of said clock signal, said second latch circuit latches output data from said first latch circuit in response to the other of the leading and trailing edges of said clock signal, and said third latch circuit latches output data from said second latch circuit in response to said one of the leading and trailing edges of said clock signal.

10. A semiconductor integrated logic circuit comprising:

an internal logic circuit;

a plurality of input/output terminals respectively connected to said internal logic circuit;

a plurality of test circuits respectively interposed between said internal logic circuit and said input/output terminals, said test circuits forming a shift register by establishing a series signal path for supplying a predetermined input test data to said internal logic circuit by sequentially shifting said input test data an receiving processed data from said internal logic circuit for sequentially shifting to a data output for comparison with a predetermined data pattern corresponding to said input test data during a testing condition while each of said test circuits passes output data of said internal logic circuit as is to said input/output terminal;

each of said test circuits operating for transferring a predetermined input test data, setting test data so as to be fetched by said internal logic circuit for processing data and setting resultant data back to rest of the said circuits, transferring the set resultant data toward a data output for comparison with a predetermined data pattern corresponding to said input test data during a testing condition while each of said test circuits passes output data of said internal logic circuit as is to said input/output terminal, each of said test circuits including first, second and third latch circuits.

* * * * *